(12) United States Patent
Yasukawa et al.

(10) Patent No.: US 9,696,365 B2
(45) Date of Patent: Jul. 4, 2017

(54) ELECTRIC LEAK DETECTOR FOR A VEHICLE

(71) Applicant: Mitsubishi Electric Corporation, Tokyo (JP)

(72) Inventors: Koichi Yasukawa, Hyogo (JP); Nobuya Toyooka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 151 days.

(21) Appl. No.: 14/624,918

(22) Filed: Feb. 18, 2015

(65) Prior Publication Data
US 2016/0091552 A1  Mar. 31, 2016

(30) Foreign Application Priority Data

Sep. 25, 2014  (JP) .................................. 2014-195193

(51) Int. Cl.
| G01R 31/14 | (2006.01) |
| G01R 31/02 | (2006.01) |
| B60L 3/00 | (2006.01) |
| G01R 31/00 | (2006.01) |

(52) U.S. Cl.
CPC .......... *G01R 31/025* (2013.01); *B60L 3/0069* (2013.01); *G01R 31/007* (2013.01)

(58) Field of Classification Search
CPC ............................ G01R 31/006; G01R 31/025

USPC ......................................................... 324/509
See application file for complete search history.

(56) References Cited

U.S. PATENT DOCUMENTS

| 6,320,389 B1 * | 11/2001 | Tamesue .............. G01R 31/007 324/509 |
| 7,102,356 B2 * | 9/2006 | Wild ..................... G01R 31/025 324/510 |
| 2012/0299599 A1 * | 11/2012 | Naruse .................. B60L 3/0069 324/509 |

FOREIGN PATENT DOCUMENTS

| JP | 2013-140074 A | 7/2013 |
| JP | 2013-195136 A | 9/2013 |
| JP | 5474114 B2 | 4/2014 |

* cited by examiner

*Primary Examiner* — Thomas Valone
(74) *Attorney, Agent, or Firm* — Sughrue Mion, PLLC; Richard C. Turner

(57) ABSTRACT

An electric leak detector (108) for a vehicle includes a coupling capacitor (210) that has a terminal (A) connected to an on-vehicle high voltage device (110) and a terminal (B) connected to a repetitive signal output circuit (212). The coupling capacitor (210) repeatedly performs a charge operation and a discharge operation in response to a repetitive signal (PLS). Determination thresholds are calculated based on a voltage applied to the terminal (A) of the coupling capacitor (210) and an atmospheric temperature. A detected charge period and a detected discharge period are compared with the determination thresholds, to thereby determine a leakage state.

10 Claims, 11 Drawing Sheets

STEP S5 REPETITIVE SIGNAL DISCHARGE-SIDE LEAKAGE DETERMINATION THRESHOLD CALCULATION PROCESSING

STEP S6 CHARGE-SIDE LEAKAGE DETERMINATION PROCESSING

STEP S7 DISCHARGE-SIDE LEAKAGE DETERMINATION PROCESSING

STEP S8 LEAKAGE WARNING PROCESSING

ELECTRIC LEAK DETECTOR FOR A VEHICLE

BACKGROUND OF THE INVENTION

1. Field of the Invention

The present invention relates to an electric leak detector for a vehicle, and more particularly, to an electric leak detector for a vehicle, which is configured to detect an electric leakage from a device mounted in a vehicle.

2. Description of the Related Art

In recent years, environmentally friendly vehicles, which have a battery mounted thereon and are configured to run with a motor used as a drive power source, have been developed. The environmentally friendly vehicles include an electric vehicle and a hybrid electric vehicle. In this type of vehicle, for example, a DC 12-V low voltage battery and a high voltage battery such as a DC 400-V battery pack are used in combination. As used herein, a low voltage refers to a voltage that is relatively lower than a high voltage, and herein, the low voltage has a range of from 0 V to 30 V, for example, and the high voltage has a range of from 100 V to 1,000 V, for example. A negative terminal of the low voltage battery is connected to a vehicle body, but the high voltage battery and a high voltage electric load to be fed and driven by the high voltage battery are insulated from the vehicle body. In the following, the high voltage battery and the high voltage electric load are collectively referred to as "high voltage device".

For such high voltage device insulated from the vehicle body, a leakage resistance detection device to be fed and driven by the low voltage battery is used to measure an insulation resistance (i.e., leakage resistance) of the high voltage device so as to detect the presence/absence of ground abnormality (see, for example, Japanese Patent No. 5474114 and Japanese Patent Application Laid-open No. 2013-140074).

The leakage resistance detection device disclosed in Japanese Patent No. 5474114 includes a coupling capacitor that has one terminal connected to a high voltage device and the other terminal connected to a repetitive signal output circuit. The coupling capacitor is charged and discharged by a switching operation of the repetitive signal output circuit. In Japanese Patent No. 5474114, a leakage resistance of the high voltage device is measured via the coupling capacitor, and the measured leakage resistance is compared with a leakage determination threshold so as to thereby perform leakage determination.

In general, however, the leakage resistance value may change depending on a change in atmospheric temperature of the coupling capacitor. In Japanese Patent No. 5474114, since no consideration is taken for a rise in atmospheric temperature of the coupling capacitor, there is a possibility that a leakage cannot be properly detected and an erroneous determination occurs.

Thus, in Japanese Patent Application Laid-open No. 2013-140074, it is proposed to set a leakage determination threshold before leakage detection is performed in consideration of the rise in atmospheric temperature of the coupling capacitor and the deterioration of elements. Specifically, in Japanese Patent Application Laid-open No. 2013-140074, before the leakage detection is performed, a crest value of an AC signal is detected under a state in which a reference impedance circuit is connected, and the detected crest value is set as a reference crest value. After that, the reference impedance circuit is disconnected, and the leakage determination is performed based on the set reference crest value.

As described above, in Japanese Patent No. 5474114, no consideration is taken for the rise in atmospheric temperature of the coupling capacitor, resulting in a problem in that a leakage may be erroneously determined.

In Japanese Patent Application Laid-open No. 2013-140074, the leakage determination threshold is set before leakage detection is performed in consideration of the rise in atmospheric temperature of the coupling capacitor and the deterioration of elements. However, the configuration disclosed in Japanese Patent Application Laid-open No. 2013-140074 cannot update the leakage determination threshold in the case where the atmospheric temperature of the coupling capacitor changes during the execution of leakage detection determination. As a result, there is a problem in that a leakage may be erroneously determined.

SUMMARY OF THE INVENTION

The present invention has been made in order to solve the problems described above, and it is an object thereof to provide an electric leak detector for a vehicle, which is capable of appropriately determining a leakage by calculating a determination threshold based on a voltage at one terminal of a coupling capacitor and an atmospheric temperature thereof during leakage determination.

According to one embodiment of the present invention, there is provided an electric leak detector for a vehicle, including: a constant voltage control power source configured to be fed and driven by a battery so as to generate a control power supply voltage, the battery including a negative terminal connected to a vehicle body; a coupling capacitor including a first terminal and a second terminal, the first terminal being connected to a leakage detection target, the second terminal being connected to the constant voltage control power source; a repetitive signal output circuit connected to the second terminal of the coupling capacitor, and configured to repeatedly connect and interrupt the second terminal to and from the constant voltage control power source in an alternating manner, to thereby repeat a charge operation and a discharge operation of the coupling capacitor; a repetitive signal output determination section configured to output a repetitive signal for switching between the connection and the interruption by the repetitive signal output circuit based on a voltage value of the second terminal; a repetitive signal charge period detection section configured to monitor the repetitive signal so as to detect a charge period of the coupling capacitor; a repetitive signal discharge period detection section configured to monitor the repetitive signal so as to detect a discharge period of the coupling capacitor; a temperature detection section configured to detect an atmospheric temperature of the coupling capacitor during the charge operation and the discharge operation of the coupling capacitor; a repetitive signal charge-side leakage determination threshold calculation section connected to the first terminal of the coupling capacitor, and configured to calculate a repetitive signal charge-side leakage determination threshold for the charge period based on a voltage applied to the first terminal and the atmospheric temperature detected by the temperature detection section; a repetitive signal discharge-side leakage determination threshold calculation section connected to the first terminal of the coupling capacitor, and configured to calculate a repetitive signal discharge-side leakage determination threshold for the discharge period based on the voltage applied to the first terminal and the atmospheric temperature detected by the temperature detection section; a charge-side leakage determination section configured to compare the charge period with the repetitive signal charge-side leakage determination threshold, and determine, when the charge period is larger than the repetitive signal charge-side leakage determination threshold, that the leakage detection target is in a leakage state; and a discharge-side leakage determination section configured to compare the discharge period with the repetitive signal discharge-side leakage determination threshold, and determine, when the discharge period is larger than the repetitive signal discharge-side leakage determination threshold, that the leakage detection target is in the leakage state.

The electric leak detector for a vehicle according to one embodiment of the present invention is configured to perform leakage determination during charge and discharge of the coupling capacitor. During the leakage determination, the voltage applied to one terminal of the coupling capacitor and the atmospheric temperature thereof are detected, and the determination threshold is calculated based on the detected values. Consequently, even when an electric charge leakage has occurred in the coupling capacitor to change the charge/discharge period, a leakage in the vehicle can be properly detected.

DETAILED DESCRIPTION OF THE PREFERRED EMBODIMENT

First Embodiment

An electric leak detector 108 for a vehicle according to a first embodiment of the present invention is a device configured to detect a leakage from an on-vehicle device during the charge/discharge period of the coupling capacitor. In the first embodiment, during the charge/discharge period of the coupling capacitor, a voltage applied to one terminal of the coupling capacitor and an atmospheric temperature thereof are measured at a constant cycle, and a determination threshold is updated according to the changes in values of the applied voltage and the atmospheric temperature. In this way, during the leakage determination, even when the voltage applied to the one terminal of the coupling capacitor or the atmospheric temperature thereof has changed so that an electric charge leakage has occurred in the coupling capacitor and the change/discharge period thereof has changed, a leakage from an on-vehicle device can be properly detected.

Figure 1:
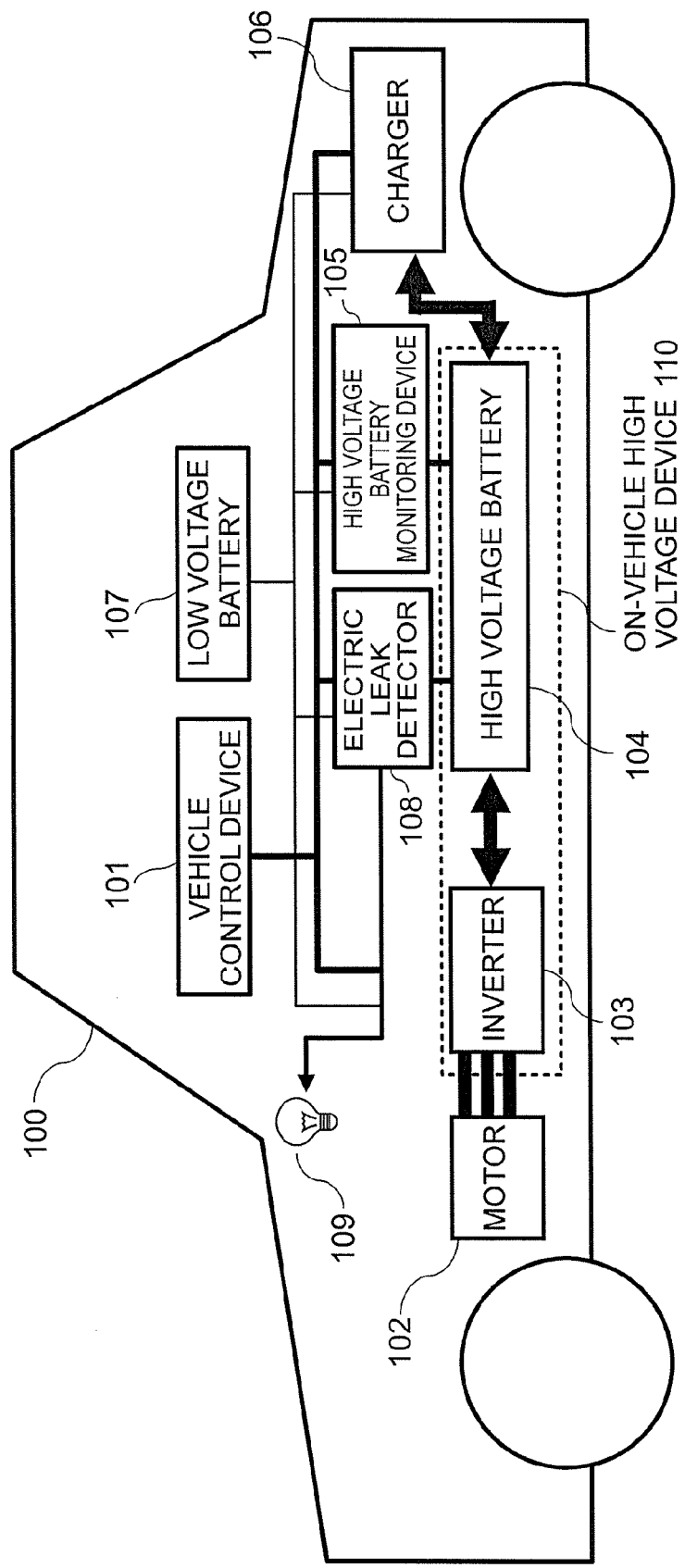
FIG. 1 is a configuration diagram illustrating a configuration of a vehicle on which an electric leak detector for a vehicle according to a first embodiment of the present invention is mounted.

FIG. 1 is an overall configuration diagram of a vehicle to which the electric leak detector 108 for a vehicle according to the first embodiment of the present invention is applied. In FIG. 1, an electric vehicle is exemplified as the vehicle, but the electric leak detector 108 for a vehicle according to the first embodiment of the present invention is applicable also to a hybrid electric vehicle.

As illustrated in FIG. 1, a vehicle body 100 includes a vehicle control device 101, a motor 102, a high voltage battery monitoring device 105, a charger 106, a low voltage battery 107, a warning lamp 109, and an on-vehicle high voltage device 110.

The vehicle control device 101 performs running control and charge control of the vehicle body 100.

The motor 102 is a drive motor for driving wheels of the vehicle body 100.

The on-vehicle high voltage device 110 includes an inverter 103 for controlling the motor 102 and a high voltage battery 104 for supplying electric power to the inverter 103.

The high voltage battery monitoring device 105 monitors the state of the high voltage battery 104.

The charger 106 charges the high voltage battery 104 from an external power source.

The low voltage battery 107 is a power source for operating the electric leak detector 108. The low voltage battery 107 has a negative terminal connected to the vehicle body 100 and a positive terminal connected to the electric leak detector 108.

The high voltage battery 104 is insulated from the vehicle body 100.

The electric leak detector 108 detects an insulation resistance (leakage resistance) between the vehicle body 100 and the high voltage battery 104.

When the electric leak detector 108 detects insulation abnormality of the high voltage battery 104, the warning lamp 109 issues a warning by lighting or flashing.

In running, the vehicle control device 101 outputs a drive request to the inverter 103 so as to drive the motor 102 based on information of the high voltage battery 104 acquired from the high voltage battery monitoring device 105. In response to the drive request, the inverter 103 drives the motor 102 with use of electric power of the high voltage battery 104.

In charging, the vehicle control device 101 outputs a charge request to the charger 106 based on the information of the high voltage battery 104 acquired from the high voltage battery monitoring device 105. In response to the charge request, the charger 106 charges the high voltage battery 104 from the external power source.

In this case, during the running and during the charging, the electric leak detector 108 detects the insulation resistance between the vehicle body 100 and the high voltage battery 104. When it is determined that a leakage has occurred, the electric leak detector 108 controls the warning lamp 109 so that the warning lamp 109 turns on or flashes.

Figure 2:
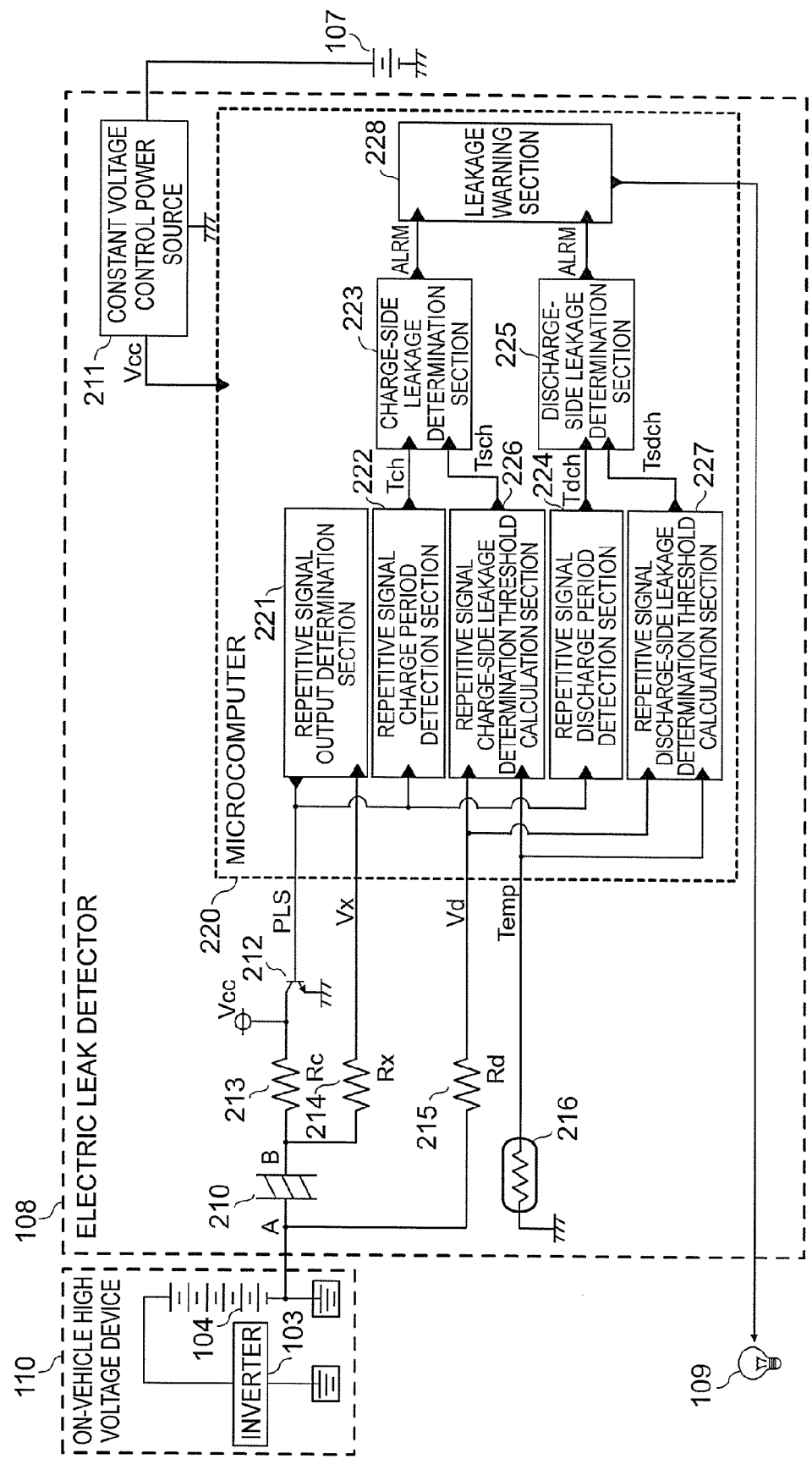
FIG. 2 is a configuration diagram illustrating a configuration of the electric leak detector for a vehicle according to the first embodiment of the present invention.

FIG. 2 is a configuration diagram of the on-vehicle high voltage device 110 and the electric leak detector 108 according to the first embodiment.

As illustrated in FIG. 2, the on-vehicle high voltage device 110 includes the high voltage battery 104 and the inverter 103, and is insulated from the vehicle body 100. The on-vehicle high voltage device 110 is a target of leakage detection by the electric leak detector 108.

The electric leak detector 108 includes a microcomputer 220. The microcomputer 220 includes a repetitive signal output determination section 221, a repetitive signal charge period detection section 222, a charge-side leakage determination section 223, a repetitive signal discharge period detection section 224, a discharge-side leakage determination section 225, a repetitive signal charge-side leakage determination threshold calculation section 226, a repetitive signal discharge-side leakage determination threshold calculation section 227, and a leakage warning section 228.

The electric leak detector 108 further includes a constant voltage control power source 211. The constant voltage control power source 211 is fed and driven by the low voltage battery 107 to generate a control power supply voltage Vcc. The control power supply voltage Vcc has a constant value. The low voltage battery 107 has the negative terminal connected to the vehicle body 100.

The electric leak detector 108 further includes a coupling capacitor 210. The coupling capacitor 210 includes a terminal A (first terminal) and a terminal B (second terminal). The terminal A of the coupling capacitor 210 is connected to the high voltage battery 104.

The terminal A of the coupling capacitor 210 is connected to the repetitive signal charge-side leakage determination threshold calculation section 226 and the repetitive signal discharge-side leakage determination threshold calculation section 227 via a voltage detection resistor 215.

The terminal B of the coupling capacitor 210 is connected to a repetitive signal output circuit 212 and the constant voltage control power source 211 via a charge/discharge resistor 213.

The terminal B of the coupling capacitor 210 is further connected to the repetitive signal output determination section 221 via a voltage detection resistor 214.

The electric leak detector 108 further includes a temperature detection section 216 configured to detect an atmospheric temperature of the coupling capacitor 210.

The repetitive signal output circuit 212 intermittently connects the terminal B of the coupling capacitor 210 (measurement point of a monitoring voltage Vx) to the control power supply voltage Vcc in response to a repetitive signal PLS output from the microcomputer 220. The repetitive signal PLS is a pulse signal having binary signal levels of "H" and "L". In accordance with the repetitive signal PLS, the repetitive signal output circuit 212 connects and interrupts the terminal B to and from the control power supply voltage Vcc in an alternating manner, to thereby charge and discharge the coupling capacitor 210 in an alternating manner. With this, the monitoring voltage Vx, which is the potential between the terminal B and the vehicle body 100, is gradually increased or gradually decreased. In this way, the microcomputer 220 detects a charge period and a discharge period based on the repetitive signal PLS to perform the insulation resistance detection and the leakage determination.

Now, a specific example of the configuration of the repetitive signal output circuit 212 is described.

The repetitive signal output circuit 212 is formed of an N-P-N transistor, for example, and includes a base terminal, a collector terminal, and an emitter terminal.

The repetitive signal PLS is input to the base terminal. The collector terminal is connected to the control power supply voltage Vcc. The collector terminal is further connected to the terminal B of the coupling capacitor 210 via the charge/discharge resistor 213. Then, the emitter terminal is connected and grounded to the vehicle body 100.

The monitoring voltage Vx is input to the repetitive signal output determination section 221 of the microcomputer 220 via the voltage detection resistor 214, and the repetitive signal output determination section 221 controls the repetitive signal PLS as follows based on predetermined voltage values Vcl and Vch (0<Vcl<Vch<Vcc holds).

Specifically, when the monitoring voltage Vx is lower than the voltage value Vcl, the repetitive signal output determination section 221 sets the logic level of the repetitive signal PLS to "L" so as to interrupt the repetitive signal output circuit 212, to thereby apply the voltage Vcc to the terminal B to charge the coupling capacitor 210. In this case, the voltage value Vcl is a lower limit threshold. The lower limit threshold is set in advance based on a specification value of charge capacity of the coupling capacitor 210, and is stored in the repetitive signal output determination section 221.

On the other hand, when the monitoring voltage Vx is equal to or higher than the voltage value Vch, the repetitive signal output determination section 221 sets the logic level of the repetitive signal PLS to "H" so as to electrically connect the repetitive signal output circuit 212, to thereby connect and ground the terminal B to the vehicle body 100 via the charge/discharge resistor 213 to discharge the coupling capacitor 210. In this case, the voltage value Vch is an upper limit threshold. The upper limit threshold is set in advance based on the specification value of the charge capacity of the coupling capacitor 210, and is stored in the repetitive signal output determination section 221.

In this way, the microcomputer 220 repeatedly charges and discharges the coupling capacitor 210 in an alternating manner.

Next, methods of detecting the charge period and the discharge period by the microcomputer 220 are described.

The repetitive signal charge period detection section 222 monitors the repetitive signal PLS to detect the period during which the logic level of the repetitive signal PLS is "L", and measures a time length of the period to output the measured time length to the charge-side leakage determination section 223 as a charge period Tch.

The repetitive signal discharge period detection section 224 monitors the repetitive signal PLS to detect the period during which the logic level of the repetitive signal PLS is "H", and measures a time length of the period to output the measured time length to the discharge-side leakage determination section 225 as a discharge period Tdch.

Next, a method of estimating the electric charge leakage of the coupling capacitor 210 by the microcomputer 220 is described.

First, a voltage Vd applied to the terminal A of the coupling capacitor 210 is input to the repetitive signal charge-side leakage determination threshold calculation section 226 and the repetitive signal discharge-side leakage determination threshold calculation section 227 via the voltage detection resistor 215.

Further, an atmospheric temperature Temp of the coupling capacitor 210 is detected by the temperature detection section 216, and is input to the repetitive signal charge-side leakage determination threshold calculation section 226 and the repetitive signal discharge-side leakage determination threshold calculation section 227.

Figure 15:
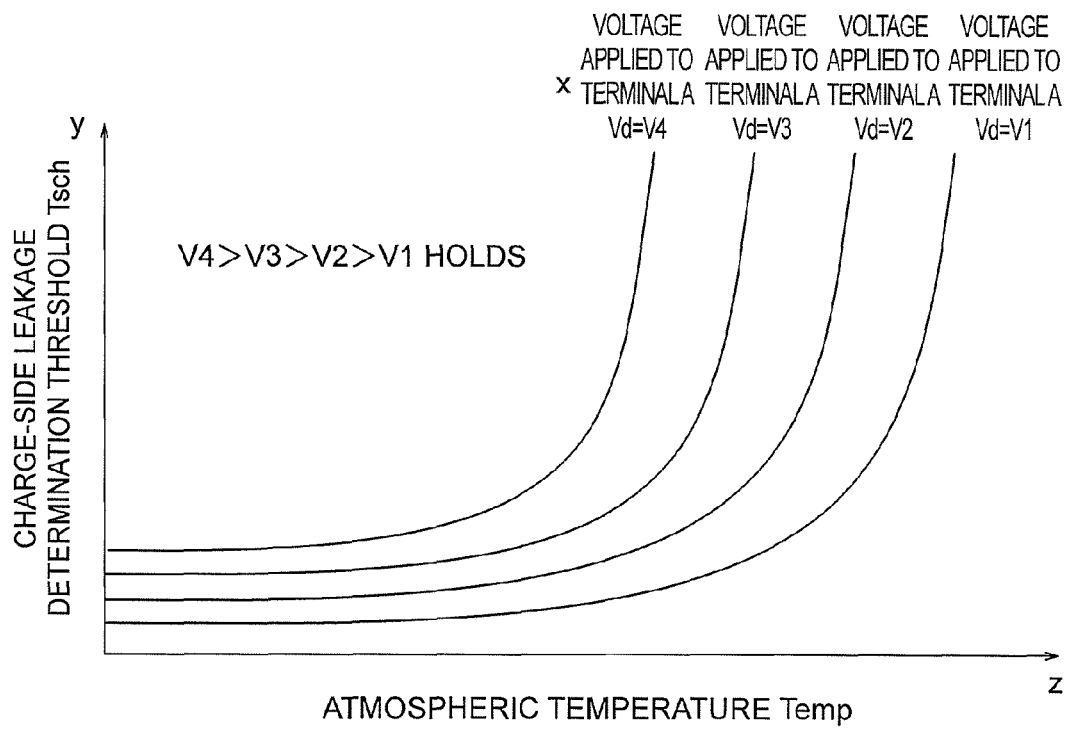
FIG. 15 is three-dimensional table data to be used in the electric leak detector for a vehicle according to the first embodiment of the present invention, in which the x-axis represents the voltage Vd applied to the terminal A, the z-axis represents the atmospheric temperature Temp, and the y-axis represents a charge-side leakage determination threshold Tsch.

The repetitive signal charge-side leakage determination threshold calculation section 226 refers to first table data shown in FIG. 15 with use of the applied voltage Vd and the atmospheric temperature Temp, to thereby calculate a charge-side leakage determination threshold Tsch, which is then output to the charge-side leakage determination section 223.

Figure 16:
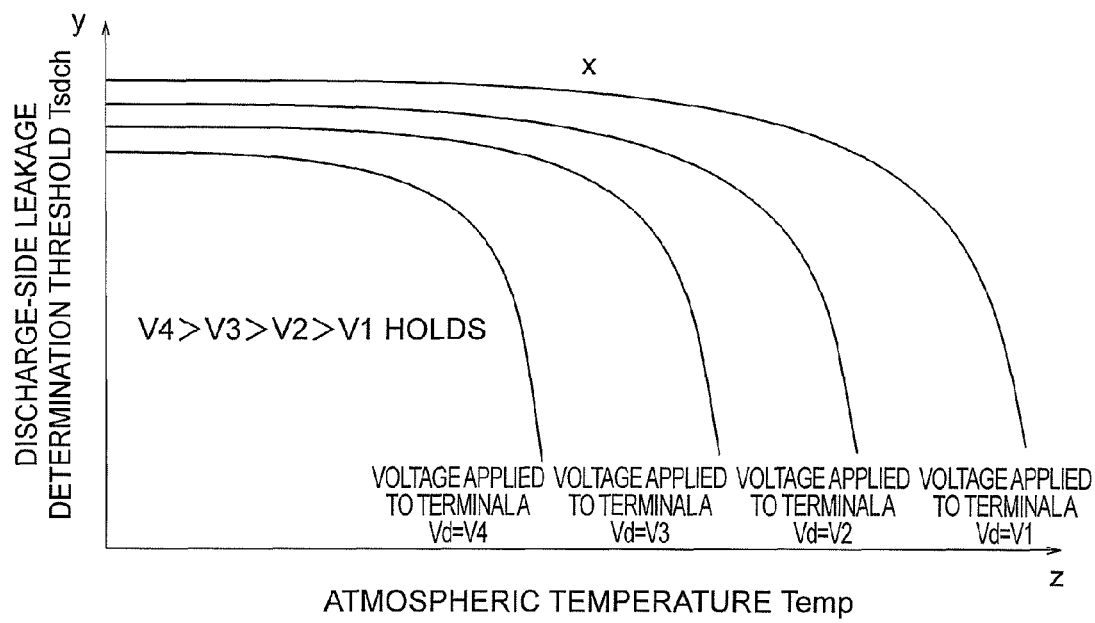
FIG. 16 is three-dimensional table data to be used in the electric leak detector for a vehicle according to the first embodiment of the present invention, in which the x-axis represents the voltage Vd applied to the terminal A, the z-axis represents the atmospheric temperature Temp, and the y-axis represents a discharge-side leakage determination threshold Tdsch.

Similarly, the repetitive signal discharge-side leakage determination threshold calculation section 227 refers to second table data shown in FIG. 16 with use of the applied voltage Vd and the atmospheric temperature Temp, to thereby calculate a discharge-side leakage determination threshold Tsdch, which is then output to the discharge-side leakage determination section 225.

The charge-side leakage determination section 223 compares the charge period Tch with the charge-side leakage determination threshold Tsch. When the charge period Tch is larger than the charge-side leakage determination threshold Tsch, the charge-side leakage determination section 223 determines that a leakage has occurred in the on-vehicle high voltage device 110, and outputs a leakage detection signal ALRM to the leakage warning section 228.

Similarly, the discharge-side leakage determination section 225 compares the discharge period Tdch with the discharge-side leakage determination threshold Tsdch. When the discharge period Tdch is larger than the discharge-side leakage determination threshold Tsdch, the discharge-side leakage determination section 225 determines that a leakage has occurred in the on-vehicle high voltage device 110, and outputs the leakage detection signal ALRM to the leakage warning section 228.

The leakage warning section 228 controls the warning lamp 109 to turn on or flash when the leakage detection signal ALRM is input.

The first table data shown in FIG. 15 is now described.

The first table data is a three-dimensional table in which the x-axis represents the voltage Vd applied to the terminal A, the z-axis represents the atmospheric temperature Temp, and the y-axis represents the charge-side leakage determination threshold Tsch. In the first table data, the charge-side leakage determination threshold Tsch is set on the y-axis so as to correspond to the x-axis and the z-axis.

Note that, FIG. 15 shows an example in which four values of V1, V2, V3, and V4 are stored in the first table data as the voltage Vd applied to the terminal A on the x-axis. In this case, V4>V3>V2>V1 holds. Note that, the values of Vd are not limited to this example, and any number of the values and any values may be stored as the values of Vd.

The repetitive signal charge-side leakage determination threshold calculation section 226 refers to the first table data with use of the applied voltage Vd and the atmospheric temperature Temp, so that the charge-side leakage determination threshold Tsch is uniquely determined.

Note that, as understood from FIG. 15, the value of the charge-side leakage determination threshold Tsch becomes larger along with the rise in atmospheric temperature Temp in regard to the same applied voltage Vd.

Further, the value of the charge-side leakage determination threshold Tsch becomes larger along with the rise in applied voltage Vd in regard to the same atmospheric temperature Temp.

Thus, the value of the charge-side leakage determination threshold Tsch becomes larger as the atmospheric temperature Temp becomes higher and as the applied voltage Vd becomes higher.

The second table data shown in FIG. 16 is now described.

The second table data is a three-dimensional table in which the x-axis represents the voltage Vd applied to the terminal A, the z-axis represents the atmospheric temperature Temp, and the y-axis represents the discharge-side leakage determination threshold Tsdch. In the second table data, the discharge-side leakage determination threshold Tsdch is set on the y-axis so as to correspond to the x-axis and the z-axis.

Note that, FIG. 16 shows an example in which four values of V1, V2, V3, and V4 are stored in the second table data as the voltage Vd applied to the terminal A on the x-axis. In this case, V4>V3>V2>V1 holds. Note that, the values of Vd are not limited to this example, and any number of the values and any values may be stored.

The repetitive signal discharge-side leakage determination threshold calculation section 227 refers to the second table data with use of the applied voltage Vd and the atmospheric temperature Temp, so that the discharge-side leakage determination threshold Tsdch is uniquely determined.

Note that, as understood from FIG. 16, the value of the discharge-side leakage determination threshold Tsdch becomes smaller along with the rise in atmospheric temperature Temp in regard to the same applied voltage Vd.

Further, the value of the discharge-side leakage determination threshold Tsch becomes smaller along with the rise in applied voltage Vd in regard to the same atmospheric temperature Temp.

Thus, the value of the discharge-side leakage determination threshold Tsdch becomes smaller as the atmospheric temperature Temp becomes higher and as the applied voltage Vd becomes higher.

Next, a coupling capacitor electric charge leakage correction control operation for accurately detecting the leakage state is described with reference to flow charts.

Figure 3:
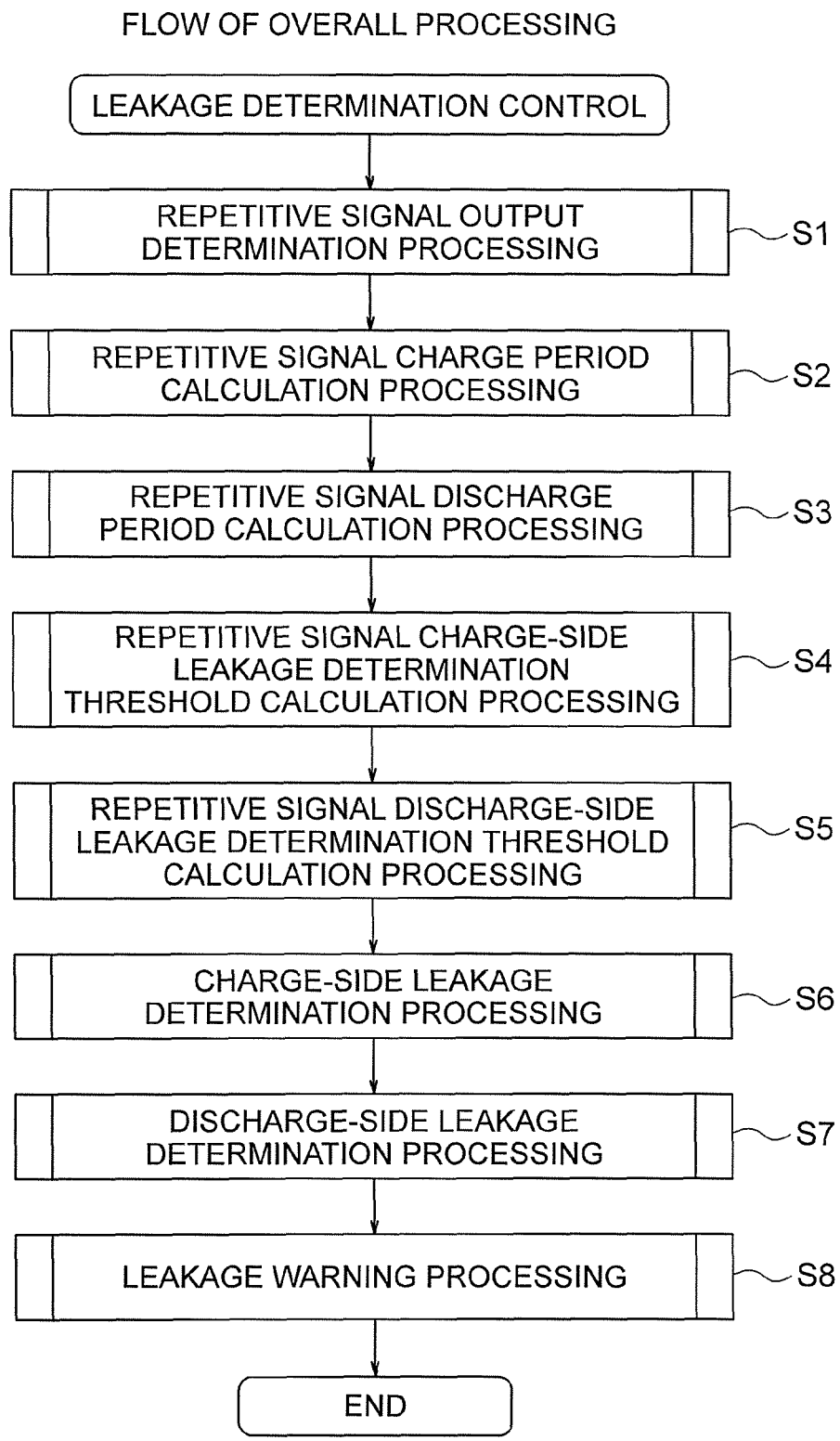
FIG. 3 is a flow chart illustrating an operation of the electric leak detector for a vehicle according to the first embodiment of the present invention.

FIG. 3 is a flow chart illustrating the outline of the operation of the electric leak detector 108. The flow of FIG. 3 includes repetitive signal output determination processing, electric charge leakage correction processing for the coupling capacitor 210, and leakage detection control processing. The flow of FIG. 3 is repeatedly executed at a predetermined cycle.

Processing of Steps S1 to S8 is briefly described below only for its outline. Details thereof are described later with reference to FIGS. 4 to 11.

As illustrated in FIG. 3, in Step S1, the repetitive signal output determination section 221 controls the repetitive signal PLS in accordance with the monitoring voltage Vx at the terminal B of the coupling capacitor 210 acquired via the voltage detection resistor 214.

In Step S2, the repetitive signal charge period detection section 222 calculates the repetitive signal charge period Tch based on the repetitive signal PLS output from the repetitive signal output determination section 221. Specifically, the repetitive signal charge period detection section 222 measures the period during which the logic level of the repetitive signal PLS is "L".

In Step S3, the repetitive signal discharge period detection section 224 calculates the repetitive signal discharge period Tdch based on the repetitive signal PLS output from the repetitive signal output determination section 221. Specifically, the repetitive signal discharge period detection section 224 measures the period during which the logic level of the repetitive signal PLS is "H".

In Step S4, the repetitive signal charge-side leakage determination threshold calculation section 226 calculates the charge-side leakage determination threshold Tsch based on the voltage Vd applied to the terminal A and the atmospheric temperature Temp.

In Step S5, the repetitive signal discharge-side leakage determination threshold calculation section 227 calculates the discharge-side leakage determination threshold Tsdch based on the voltage Vd applied to the terminal A and the atmospheric temperature Temp.

In Step S6, the charge-side leakage determination section 223 compares the repetitive signal charge period Tch with the charge-side leakage determination threshold Tsch to determine whether or not the on-vehicle high voltage device is in the leakage state. When it is determined that the on-vehicle high voltage device is in the leakage state, the charge-side leakage determination section 223 outputs the leakage detection signal ALRM.

In Step S7, the discharge-side leakage determination section 225 compares the repetitive signal discharge period Tdch with the discharge-side leakage determination threshold Tsdch to determine whether or not the on-vehicle high voltage device is in the leakage state. When it is determined that the on-vehicle high voltage device is in the leakage state, the discharge-side leakage determination section 225 outputs the leakage detection signal ALRM.

In Step S8, the electric leak detector 108 controls the warning lamp 109 to turn on based on the leakage detection signal ALRM.

Now, the details of Steps S1 to S8 of FIG. 3 are described with reference to FIGS. 4 to 11.

Figure 4:
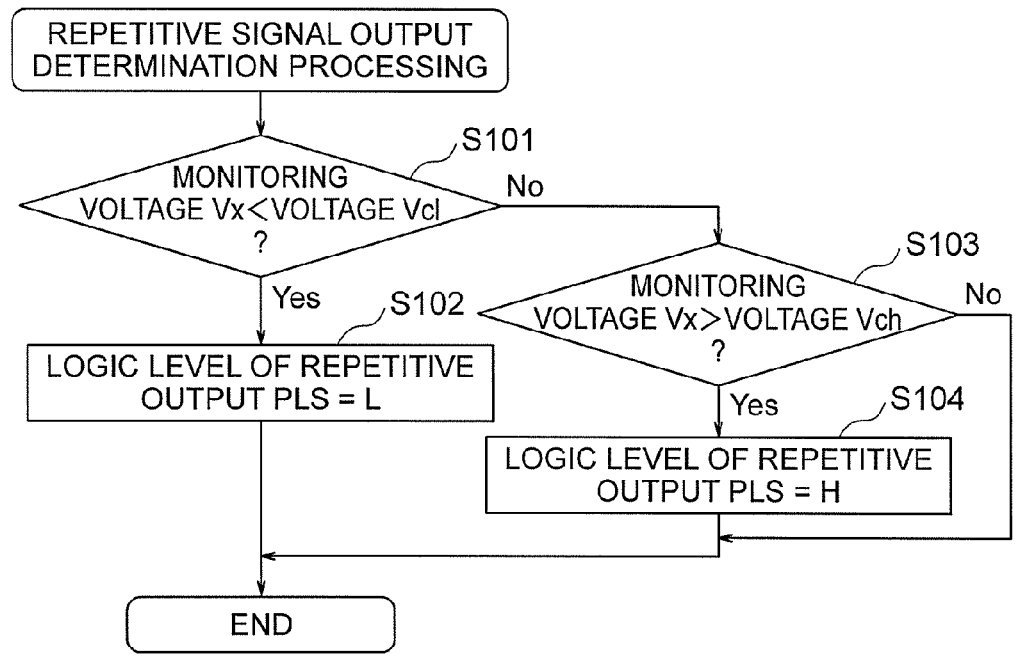
FIG. 4 is a flow chart illustrating details of repetitive signal PLS output processing in the electric leak detector for a vehicle according to the first embodiment of the present invention.

FIG. 4 is a flow chart illustrating details of Step S1 of FIG. 3. Processing of FIG. 4 is performed by the repetitive signal output determination section 221.

First, in Step S101, the monitoring voltage Vx is compared with the predetermined voltage value Vcl. When the monitoring voltage Vx is lower than the voltage value Vcl, the processing proceeds to Step S102. On the other hand, when the monitoring voltage Vx is equal to or higher than the voltage value Vcl, the processing proceeds to Step S103.

In Step S102, the logic level of the repetitive signal PLS is set to "L", and the processing is finished.

In Step S103, the monitoring voltage Vx is compared with the predetermined voltage value Vch. When the monitoring voltage Vx is higher than the voltage value Vch, the processing proceeds to Step S104. On the other hand, when the monitoring voltage Vx is equal to or lower than the voltage value Vch, the processing is finished without any further step.

In Step S104, the logic level of the repetitive signal PLS is set to "H", and the processing is finished.

Figure 5:
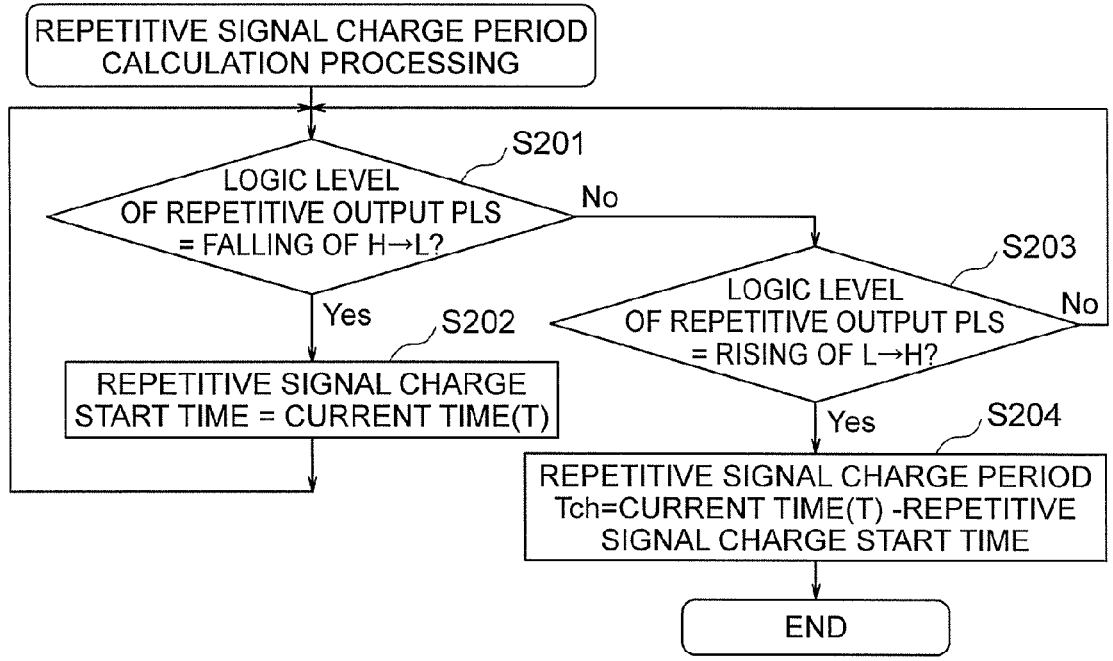
FIG. 5 is a flow chart illustrating details of repetitive signal charge period calculation processing in the electric leak detector for a vehicle according to the first embodiment of the present invention.

FIG. 5 is a flowchart illustrating details of Step S2 of FIG. 3. Processing of FIG. 5 is performed by the repetitive signal charge period detection section 222.

First, in Step S201, it is determined whether or not the repetitive signal PLS has a falling edge at which the logic level thereof has transitioned from "H" to "L". When it is determined that the repetitive signal PLS has a falling edge, the processing proceeds to Step S02. On the other hand, when it is determined that the repetitive signal PLS has no falling edge, the processing proceeds to Step S203.

In Step S202, the current time is set as a repetitive signal charge start time Tch_start, and the processing returns to Step S201.

In Step S203, it is determined whether or not the repetitive signal PLS has a rising edge at which the logic level thereof has transitioned from "L" to "H". When it is determined that the repetitive signal PLS has a rising edge, the processing proceeds to Step S204. On the other hand, when it is determined that the repetitive signal PLS has no rising edge, the processing returns to Step S201.

In Step S204, a difference between the current time and the repetitive signal charge start time Tch_start is calculated, and the calculated difference is set as the repetitive signal charge period Tch.

Figure 6:
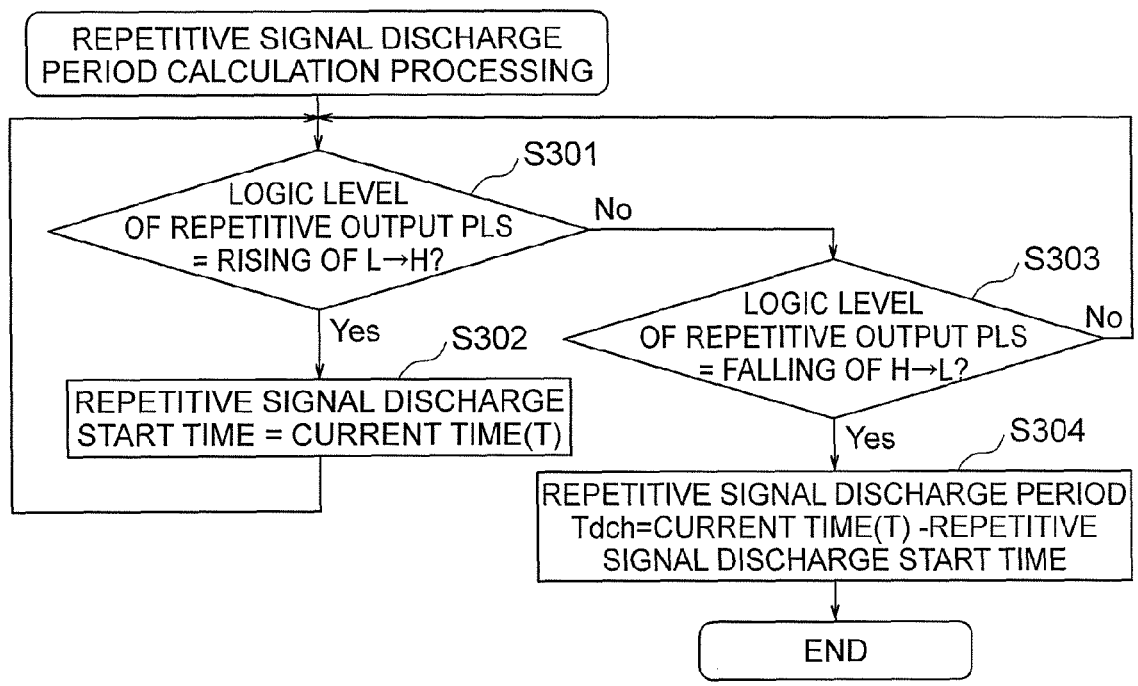
FIG. 6 is a flow chart illustrating details of repetitive signal discharge period calculation processing in the electric leak detector for a vehicle according to the first embodiment of the present invention.

FIG. 6 is a flowchart illustrating details of Step S3 of FIG. 3. Processing of FIG. 6 is performed by the repetitive signal discharge period detection section 224.

First, in Step S301, it is determined whether or not the repetitive signal PLS has a rising edge at which the logic level thereof has transitioned from "L" to "H". When it is determined that the repetitive signal PLS has a rising edge, the processing proceeds to Step S302. On the other hand, when it is determined that the repetitive signal PLS has no rising edge, the processing proceeds to Step S303.

In Step S302, the current time is set as a repetitive signal discharge start time Tdch_start, and the processing returns to Step S301.

In Step S303, it is determined whether or not the repetitive signal PLS has a falling edge at which the logic level thereof has transitioned from "H" to "L". When it is determined that the repetitive signal PLS has a falling edge, the processing proceeds to Step S304. On the other hand, when it is determined that the repetitive signal PLS has no falling edge, the processing returns to Step S301.

In Step S304, a difference between the current time and the repetitive signal discharge start time Tdch_start is calculated. The calculated difference is set as the repetitive signal discharge period Tdch.

Figure 7:
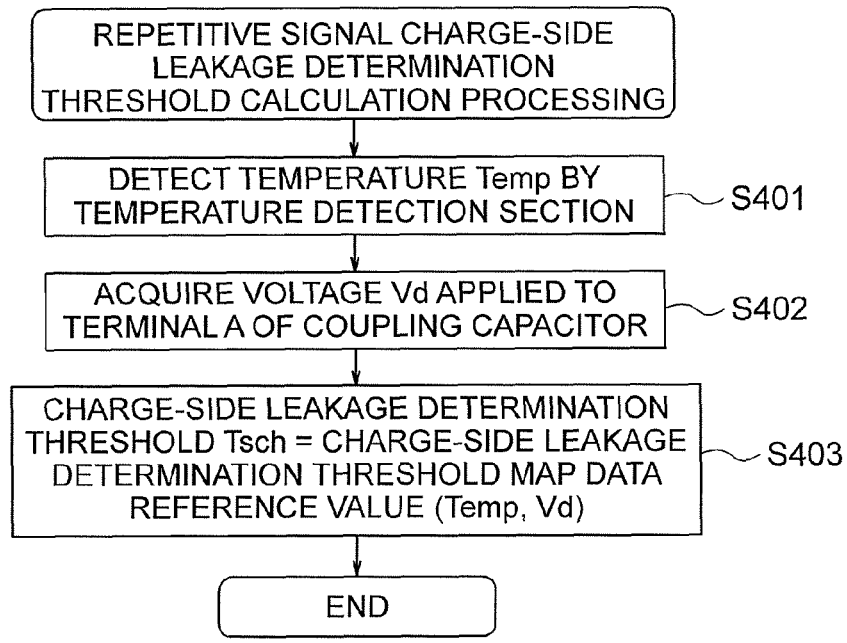
FIG. 7 is a flow chart illustrating details of repetitive signal charge-side leakage determination threshold calculation processing in the electric leak detector for a vehicle according to the first embodiment of the present invention.

FIG. 7 is a flowchart illustrating details of Step S4 of FIG. 3. Processing of FIG. 7 is performed by the repetitive signal charge-side leakage determination threshold calculation section 226.

First, in Step S401, the atmospheric temperature Temp detected by the temperature detection section 216 is acquired.

Next, in Step S402, the voltage Vd applied to the terminal A of the coupling capacitor 210 is acquired via the voltage detection resistor 215.

Next, in Step S403, the first table data shown in FIG. 15 is referred to with use of the voltage Vd applied to the terminal A and the atmospheric temperature Temp, to thereby calculate the charge-side leakage determination threshold Tsch.

Figure 8:
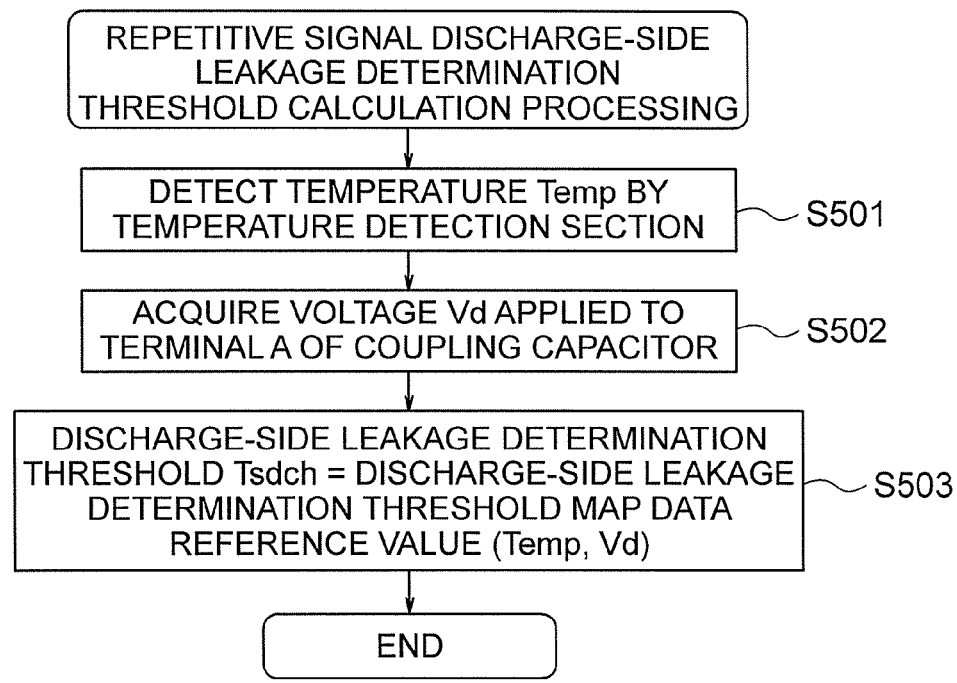
FIG. 8 is a flow chart illustrating details of repetitive signal discharge-side leakage determination threshold calculation processing in the electric leak detector for a vehicle according to the first embodiment of the present invention.

FIG. 8 is a flowchart illustrating details of Step S5 of FIG. 3. Processing of FIG. 8 is performed by the repetitive signal discharge-side leakage determination threshold calculation section 227.

First, in Step S501, the atmospheric temperature Temp detected by the temperature detection section 216 is acquired.

Next, in Step S502, the voltage Vd applied to the terminal A of the coupling capacitor 210 is acquired via the voltage detection resistor 215.

Next, in Step S503, the second table data shown in FIG. 16 is referred to with use of the voltage Vd applied to the terminal A and the atmospheric temperature Temp, to thereby calculate the discharge-side leakage determination threshold Tsdch.

Figure 9:
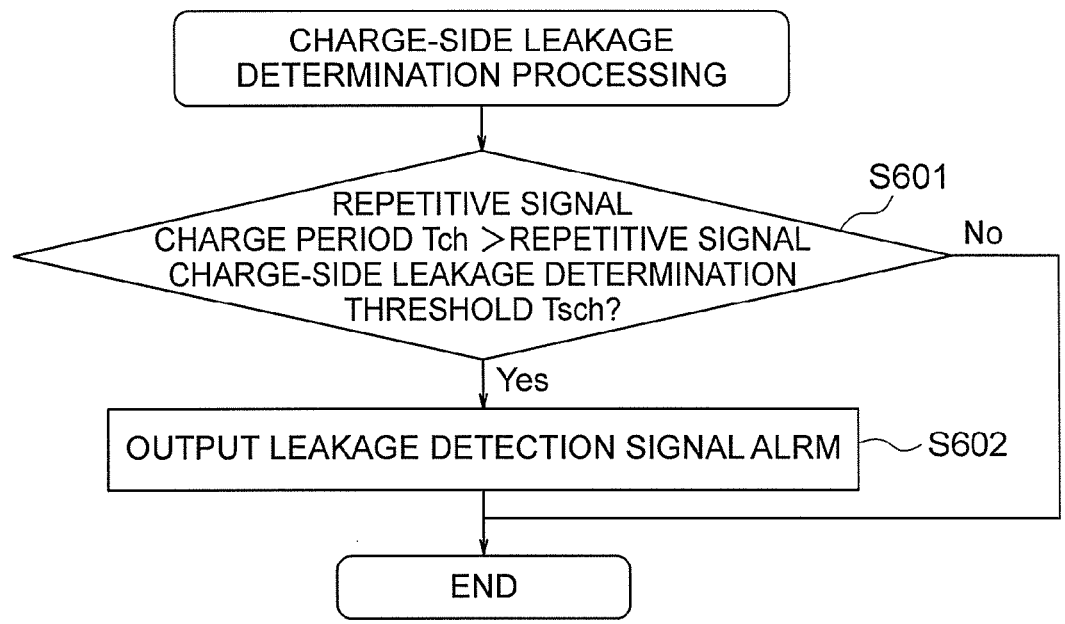
FIG. 9 is a flow chart illustrating details of charge-side leakage determination processing in the electric leak detector for a vehicle according to the first embodiment of the present invention.

FIG. 9 is a flowchart illustrating details of Step S6 of FIG. 3. Processing of FIG. 9 is performed by the charge-side leakage determination section 223.

First, in Step S601, it is determined whether or not the repetitive signal charge period Tch is larger than the charge-side leakage determination threshold Tsch. When the repetitive signal charge period Tch is larger than the charge-side leakage determination threshold Tsch, the processing proceeds to Step S602. Otherwise, the processing is finished without any further step.

In Step S602, the leakage detection signal ALRM is output to the leakage warning section 228.

Figure 10:
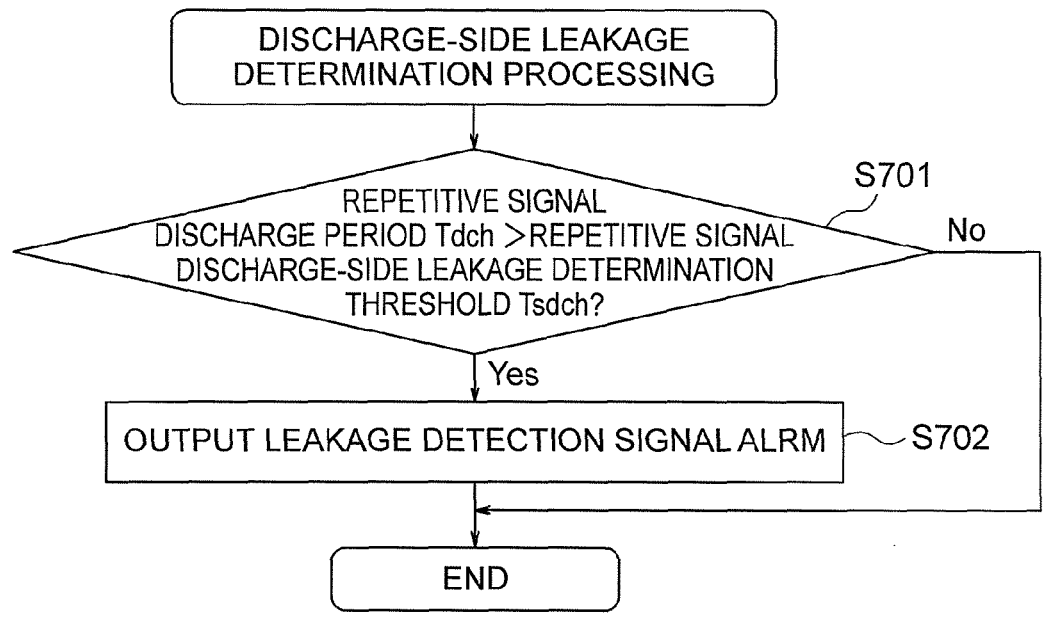
FIG. 10 is a flow chart illustrating details of discharge-side leakage determination processing in the electric leak detector for a vehicle according to the first embodiment of the present invention.

FIG. 10 is a flow chart illustrating details of Step S7 of FIG. 3. Processing of FIG. 10 is performed by the discharge-side leakage determination section 225.

First, in Step S701, it is determined whether or not the repetitive signal discharge period Tdch is larger than the discharge-side leakage determination threshold Tsdch. When the repetitive signal discharge period Tdch is larger than the discharge-side leakage determination threshold Tsdch, the processing proceeds to Step S702. Otherwise, the processing is finished without any further step.

In Step S702, the leakage detection signal ALRM is output to the leakage warning section 228.

Figure 11:
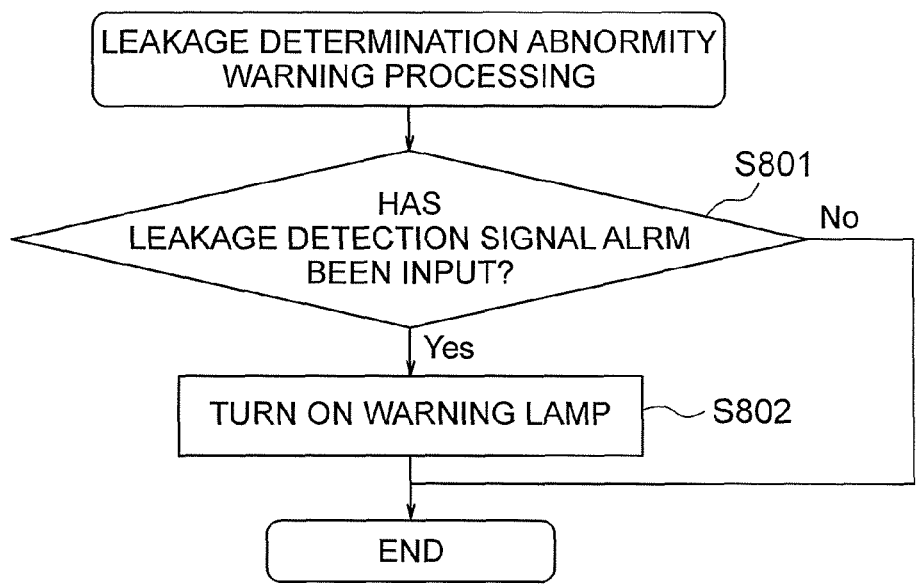
FIG. 11 is a flow chart illustrating details of leakage warning processing in the electric leak detector for a vehicle according to the first embodiment of the present invention.

FIG. 11 is a flow chart illustrating details of Step S8 of FIG. 3. Processing of FIG. 11 is performed by the leakage warning section 228.

First, in Step S801, it is determined whether or not the leakage detection signal ALRM has been input. When the leakage detection signal ALRM has been input, the processing proceeds to Step S802. When the leakage detection signal ALRM has not been input, the processing is finished without any further step.

In Step S802, the warning lamp 109 is controlled to turn on or flash.

Next, an effect of the electric leak detector 108 according to the first embodiment is described with reference to timing charts of FIGS. 13 and 14.

Prior to the description of the effect, the problem in the related-art detection method disclosed in Japanese Patent Application Laid-open No. 2013-140074 is described with reference to FIG. 12.

In general, when the atmospheric temperature of the coupling capacitor rises, the amount of electric charge leakage in the coupling capacitor is increased. Accordingly, the charge period of the coupling capacitor becomes longer, whereas the discharge period thereof becomes shorter. Thus, in Japanese Patent No. 5474114 and Japanese Patent Application Laid-open No. 2013-140074, it may be erroneously determined that a leakage has occurred in the on-vehicle high voltage device even though no leakage has occurred.

Figure 12:
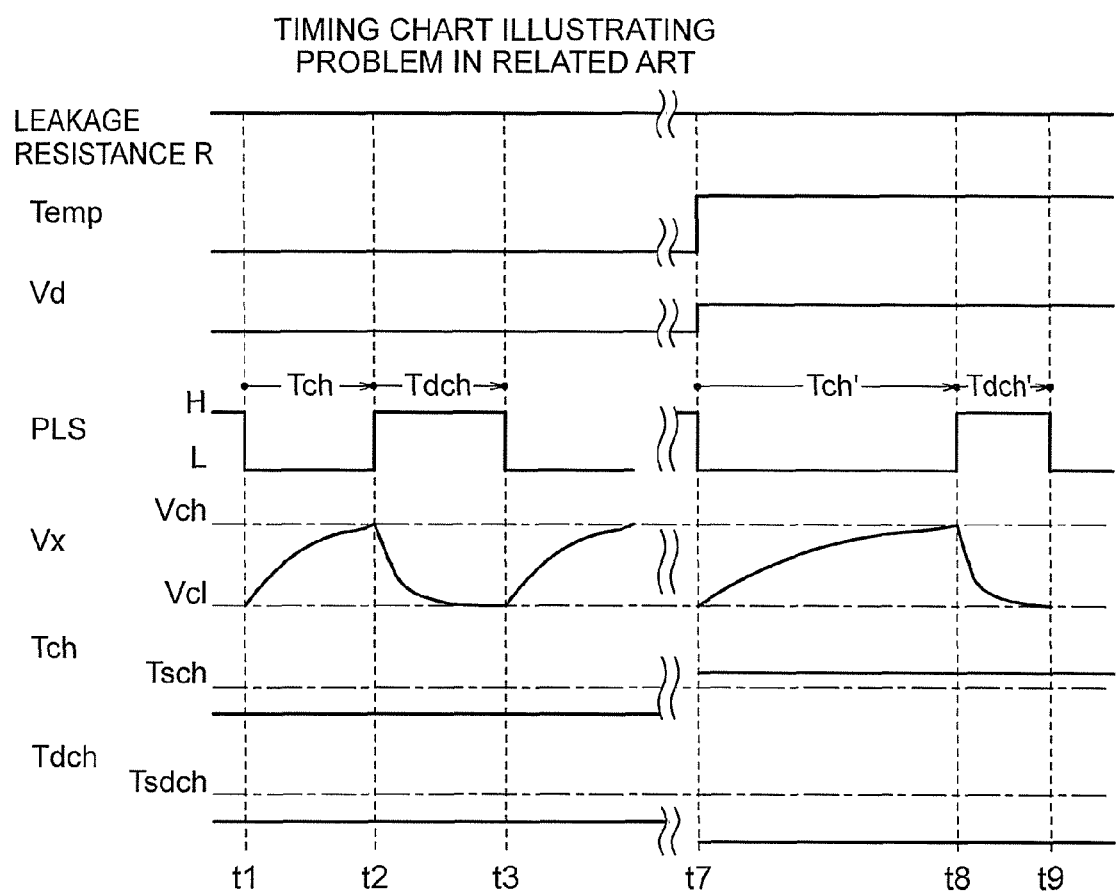
FIG. 12 is a timing chart illustrating a problem in the related art.

The above-mentioned operation is shown in a timing chart of FIG. 12. The vertical axis of FIG. 12 represents, from the top, a leakage resistance R, the atmospheric temperature Temp, the voltage Vd applied to one terminal of the coupling capacitor, the repetitive signal PLS, the monitoring voltage Vx, the repetitive signal charge period Tch, and the repetitive signal discharge period Tdch. The horizontal axis of FIG. 12 represents time.

It is assumed that the atmospheric temperature Temp and the applied voltage Vd are set in advance. In this case, a voltage applied to a terminal of the coupling capacitor that is connected to the repetitive signal output circuit is represented by "monitoring voltage Vx". In a charge period Tch from a time t1 to a time t2 in FIG. 12, the coupling capacitor is charged so that the monitoring voltage Vx gradually increases from the voltage value Vcl (lower limit threshold) to the voltage value Vch (upper limit threshold). Between the time t1 and the time t2, the charge period Tch is equal to or less than the leakage determination threshold Tsch.

In a discharge period Tdch from the time t2 to a time t3 in FIG. 12, the coupling capacitor is discharged so that the monitoring voltage Vx gradually decreases from the voltage value Vch to the voltage value Vcl. Between the time t2 and the time t3, the discharge period Tdch is equal to or less than the discharge-side leakage determination threshold Tsdch.

As a result of the above, it is determined that the on-vehicle high voltage device is not in the leakage state.

However, after a time t7 in FIG. 12, the atmospheric temperature Temp rises to be equal to or more than a preset threshold (not shown).

In this case, an electric charge leakage occurs in the coupling capacitor.

In a charge period Tch' from the time t7 to a time t8 in FIG. 12, the coupling capacitor is charged so that the monitoring voltage Vx gradually increases from the voltage value Vcl to the voltage value Vch.

In a discharge period Tdch' from the time t8 to a time t9 in FIG. 12, the coupling capacitor is discharged so that the monitoring voltage Vx gradually decreases from the voltage value Vch to the voltage value Vcl. Between the time t8 and the time t9, the discharge period Tdch' is equal to or less than the leakage determination threshold Tsdch.

However, in the charge period from the time t7 to the time t8, the charge period Tch' exceeds the leakage determination threshold Tsch, and hence it is erroneously determined that a leakage has occurred in the on-vehicle high voltage device.

As described above, in Japanese Patent Application Laid-open No. 2013-140074, if the atmospheric temperature Temp has changed during the execution of the leakage detection determination, the leakage determination threshold Tsch or Tsdch cannot be updated. Thus, there is a problem in that it may be erroneously determined that a leakage has occurred in the on-vehicle high voltage device.

Now, the effect of the electric leak detector 108 according to the first embodiment is described with reference to the timing charts of FIGS. 13 and 14.

Figure 13:
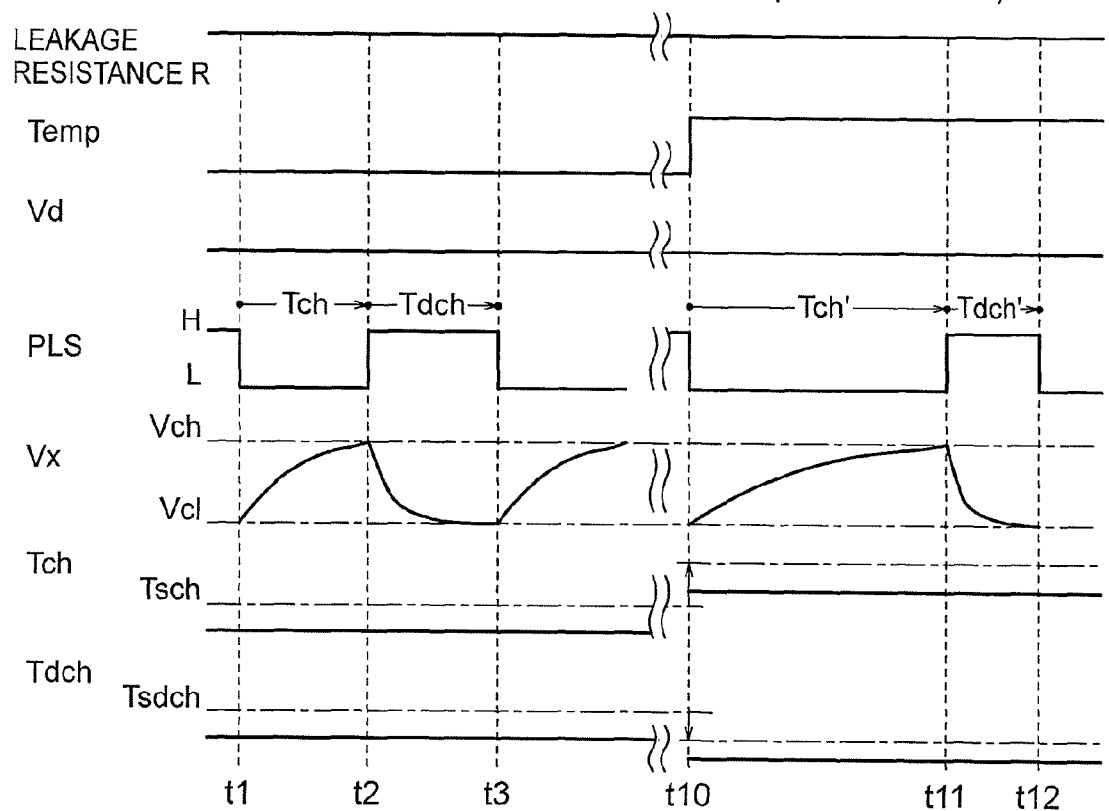
FIG. 13 is a timing chart illustrating an effect of the electric leak detector for a vehicle according to the first embodiment of the present invention (when an atmospheric temperature Temp has changed).

FIG. 13 shows the operation when the atmospheric temperature Temp has changed.

In FIG. 13, the vertical axis represents, from the top, the leakage resistance R, the atmospheric temperature Temp, the voltage Vd applied to the terminal A, the repetitive signal PLS, the monitoring voltage Vx, the repetitive signal charge period Tch, and the repetitive signal discharge period Tdch. The horizontal axis represents time.

An operation between times t1 to t3 is the same as that of FIG. 12 described above, and a description thereof is herein omitted.

It is assumed that the atmospheric temperature Temp has risen at a time t10.

In this case, the coupling capacitor 210 is charged until the monitoring voltage Vx increases from the voltage value Vcl to the voltage value Vch. Because an electric charge leakage in the coupling capacitor 210 is increased due to the rise in atmospheric temperature Temp, a period Tch' necessary for the charge (period Tch' from time t10 to time t11) becomes longer than the period Tch in the normal case (Tch'>Tch).

On the other hand, when the coupling capacitor 210 is discharged until the monitoring voltage Vx decreases from the voltage value Vch to the voltage value Vcl, a period Tdch' necessary for the discharge (period Tdch' from time t11 to time t12) becomes shorter than the period Tdch in the normal case (Tdch'<Tdch).

In this embodiment, the repetitive signal charge-side leakage determination threshold calculation section 226 and the repetitive signal discharge-side leakage determination threshold calculation section 227 respectively calculate the charge-side leakage determination threshold Tsch and the discharge-side leakage determination threshold Tsdch corresponding to the atmospheric temperature Temp and the voltage Vd applied to the terminal A. Specifically, as shown in FIG. 13, the value of the charge-side leakage determination threshold Tsch becomes larger and the value of the discharge-side leakage determination threshold Tsdch becomes smaller along with the rise in atmospheric temperature Temp. Consequently, (repetitive signal charge period Tch')≤(charge-side leakage determination threshold Tsch) and (repetitive signal discharge period Tdch')≤(discharge-side leakage determination threshold Tsdch) are established. As a result, an erroneous determination that a leakage has occurred can be prevented.

Figure 14:
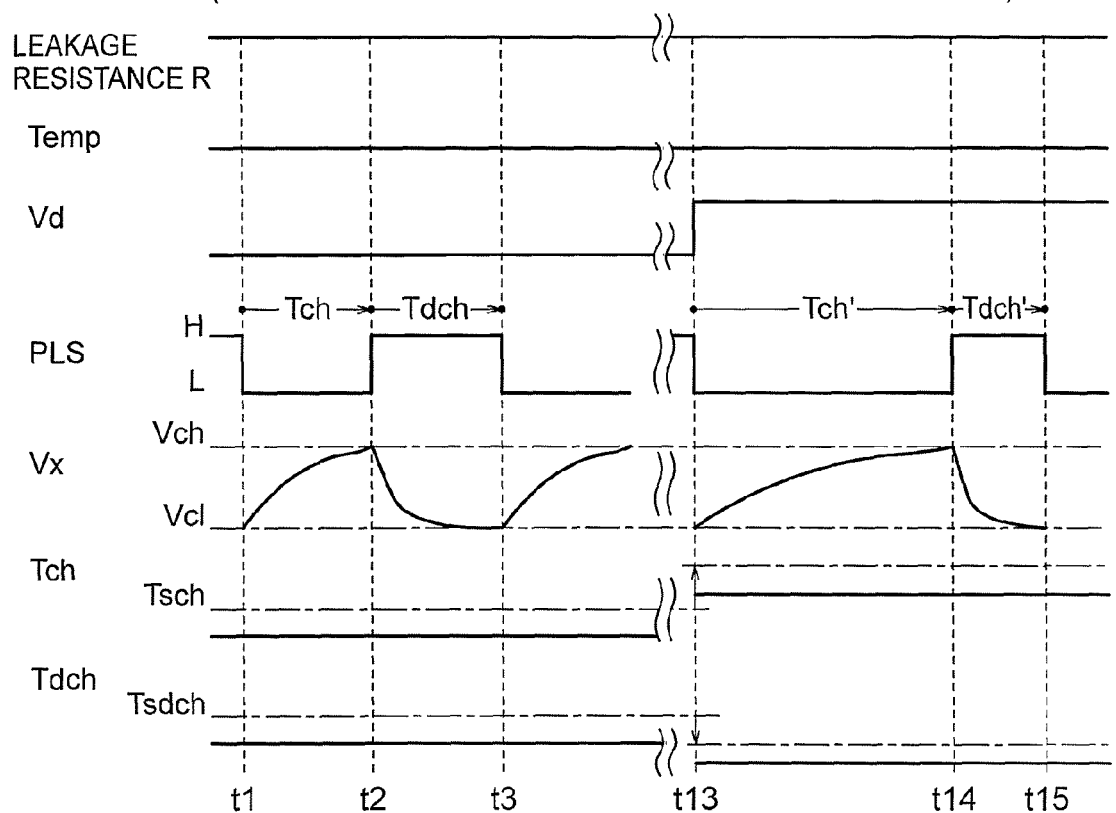
FIG. 14 is a timing chart illustrating an effect of the electric leak detector for a vehicle according to the first embodiment of the present invention (when a voltage Vd at a terminal A has changed).

FIG. 14 shows the operation when the voltage Vd applied to the terminal A has changed.

In FIG. 14, the vertical axis represents, from the top, the leakage resistance R, the atmospheric temperature Temp, the voltage Vd applied to the terminal A, the repetitive signal PLS, the monitoring voltage Vx, the repetitive signal charge period Tch, and the repetitive signal discharge period Tdch. The horizontal axis represents time.

An operation between times t1 to t3 is the same as that of FIG. 12 described above, and a description thereof is herein omitted.

It is assumed that the voltage Vd applied to the terminal A has risen at a time t13.

In this case, the coupling capacitor 210 is charged until the monitoring voltage Vx increases from the voltage value Vcl to the voltage value Vch. Because an electric charge leakage in the coupling capacitor 210 is increased due to the rise in the applied voltage Vd, a period Tch' necessary for the charge (period Tch' from time t13 to time t14) becomes longer than the period Tch in the normal case (Tch'>Tch).

On the other hand, when the coupling capacitor 210 is discharged until the monitoring voltage Vx decreases from the voltage value Vch to the voltage value Vcl, a period Tdch' necessary for the discharge (period Tdch' from time t14 to time t15) becomes shorter than the period Tdch in the normal case (Tdch'<Tdch).

In this embodiment, the repetitive signal charge-side leakage determination threshold calculation section 226 and the repetitive signal discharge-side leakage determination threshold calculation section 227 respectively calculate the charge-side leakage determination threshold Tsch and the discharge-side leakage determination threshold Tsdch corresponding to the atmospheric temperature Temp and the voltage Vd applied to the terminal A. Specifically, as shown in FIG. 14, the value of the charge-side leakage determination threshold Tsch becomes larger and the value of the discharge-side leakage determination threshold Tsdch becomes smaller along with the rise in the applied voltage Vd. Consequently, (repetitive signal charge period Tch')≤(charge-side leakage determination threshold Tsch) and (repetitive signal discharge period Tdch')≤(discharge-side leakage determination threshold Tsdch) hold. As a result, an erroneous determination that a leakage has occurred can be prevented.

Referring to FIGS. 13 and 14, a description has been given of the examples in which the atmospheric temperature Temp and the voltage Vd applied to the terminal A have independently changed. In this embodiment, however, even when the atmospheric temperature Temp and the voltage Vd applied to the terminal A have simultaneously changed, an erroneous detection of the leakage state due to the change in electric charge leakage in the coupling capacitor can be prevented.

As described above, the electric leak detector 108 according to this embodiment includes the coupling capacitor 210 that has one terminal (terminal A) connected to the on-vehicle high voltage device 110 and the other terminal (terminal B) connected to the repetitive signal output circuit 212. The coupling capacitor 210 is charged and discharged in response to the repetitive signal PLS output from the repetitive signal output determination section 221. The repetitive signal charge period detection section 222 and the repetitive signal discharge period detection section 224 respectively detect the charge period Tch and the discharge period Tdch of the coupling capacitor 210. The charge-side leakage determination section 223 and the discharge-side leakage determination section 225 respectively compare the detected charge period Tch and the detected discharge period Tdch with the charge-side leakage determination threshold Tsch and the discharge-side leakage determination threshold Tsdch, to thereby determine the leakage state of the on-vehicle high voltage device 110. In this case, in this embodiment, the atmospheric temperature Temp of the coupling capacitor 210 and the voltage applied to the one terminal (terminal A) of the coupling capacitor 210 are measured at a constant cycle. In this way, the repetitive signal charge-side leakage determination threshold calculation section 226 and the repetitive signal discharge-side leakage determination threshold calculation section 227 respectively update the charge-side leakage determination threshold Tsch and the discharge-side leakage determination threshold Tsdch in accordance with the measured applied voltage and atmospheric temperature. Consequently, it can be properly detected whether or not a leakage has occurred, even when the applied voltage or the atmospheric temperature has risen, and an electric charge leakage has occurred in the coupling capacitor 210 to change the charge/discharge period.

Further, in this embodiment, the repetitive signal charge-side leakage determination threshold calculation section 226 and the repetitive signal discharge-side leakage determination threshold calculation section 227 respectively calculate the charge-side leakage determination threshold Tsch and the discharge-side leakage determination threshold Tsdch by using the first table data and the second table data shown in FIG. 15 and FIG. 16. Consequently, the processing load and the processing time can be reduced as compared with the case where the thresholds are calculated through complicated operation.

What is claimed is:

1. An electric leak detector for a vehicle, the electric leak detector comprising:
    a constant voltage control power source configured to be fed and driven by a battery so as to generate a control power supply voltage, the battery including a negative terminal connected to a vehicle body;
    a coupling capacitor including a first terminal and a second terminal, the first terminal being connected to a leakage detection target, the second terminal being connected to the constant voltage control power source;
    a repetitive signal output circuit connected to the second terminal of the coupling capacitor, and configured to repeatedly connect and interrupt the second terminal to and from the constant voltage control power source in an alternating manner, to thereby repeat a charge operation and a discharge operation of the coupling capacitor;
    a temperature detection section configured to detect a temperature of the coupling capacitor during the charge operation and the discharge operation of the coupling capacitor;
    a processor configured to execute a program;
    a memory that stores the program which, when executed by the processor, causes the processor to execute steps comprising:
    outputting a repetitive signal for switching between the connection and the interruption by the repetitive signal output circuit based on a voltage value of the second terminal;
    monitoring the repetitive signal to detect a charge period of the coupling capacitor;
    monitoring the repetitive signal to detect a discharge period of the coupling capacitor;
    calculating a repetitive signal charge-side leakage determination threshold for the charge period based on a voltage applied to the first terminal of the coupling capacitor and the temperature of the coupling capacitor detected by the temperature detection section;
    calculating a repetitive signal discharge-side leakage determination threshold for the discharge period based on the voltage applied to the first terminal of the coupling capacitor and the temperature of the coupling capacitor detected by the temperature detection section;
    comparing the charge period with the repetitive signal charge-side leakage determination threshold, and determining that a charge-side leakage occurs in the leakage detection target when the charge period is larger than the repetitive signal charge-side leakage determination threshold; and
    comparing the discharge period with the repetitive signal discharge-side leakage determination threshold, and determining that a discharge-side leakage occurs in the leakage detection target when the discharge period is larger than the repetitive signal discharge-side leakage determination threshold,
    wherein the calculating the repetitive signal charge-side leakage determination threshold comprises:
    increasing the repetitive signal charge-side leakage determination threshold when the voltage applied to the first terminal of the coupling capacitor increases or the temperature of the coupling capacitor increases; and
    decreasing the repetitive signal charge-side leakage determination threshold when the voltage applied to the first terminal of the coupling capacitor decreases or the temperature of the coupling capacitor decreases.

2. An electric leak detector for a vehicle according to claim 1, wherein the calculating of the repetitive signal charge-side leakage determination threshold comprises:
    storing first table data in which values of the temperature of the coupling capacitor, values of the voltage to be applied to the first terminal of the coupling capacitor, and values of the repetitive signal charge-side leakage determination threshold are stored in association with one another, and
    calculating the repetitive signal charge-side leakage determination threshold based on the detected temperature of the coupling capacitor and the voltage actually applied to the first terminal, by referring to the stored first table data.

3. An electric leak detector for a vehicle according to claim 1, wherein the calculating of the repetitive signal discharge-side leakage determination threshold comprises:
    storing second table data in which values of the temperature of the coupling capacitor, values of the voltage to be applied to the first terminal of the coupling capacitor, and values of the repetitive signal discharge-side leakage determination threshold are stored in association with one another, and
    calculating the repetitive signal discharge-side leakage determination threshold based on the detected temperature of the coupling capacitor and the voltage actually applied to the first terminal, by referring to the stored second table data.

4. An electric leak detector for a vehicle according to claim 1, wherein the program results in performance of a further step comprising,
    turning on a warning lamp mounted on the vehicle body when it is determined that the charge-side leakage occurs in the leakage detection target or the discharge-side leakage occurs in the leakage detection target.

5. An electric leak detector for a vehicle of claim 1, wherein the calculating the repetitive signal discharge-side leakage determination threshold comprises:
    decreasing the repetitive signal discharge-side leakage determination threshold when the voltage applied to the first terminal of the coupling capacitor increases or the temperature of the coupling capacitor increases; and
    increasing the repetitive signal discharge-side leakage determination threshold when the voltage applied to the first terminal of the coupling capacitor decreases or the temperature of the coupling capacitor decreases.

6. An electric leak detector for a vehicle, the electric leak detector comprising:

a constant voltage control power source configured to be fed and driven by a battery so as to generate a control power supply voltage, the battery including a negative terminal connected to a vehicle body;

a coupling capacitor including a first terminal and a second terminal, the first terminal being connected to a leakage detection target, the second terminal being connected to the constant voltage control power source;

a repetitive signal output circuit connected to the second terminal of the coupling capacitor, and configured to repeatedly connect and interrupt the second terminal to and from the constant voltage control power source in an alternating manner, to thereby repeat a charge operation and a discharge operation of the coupling capacitor;

a temperature detection section configured to detect a temperature of the coupling capacitor during the charge operation and the discharge operation of the coupling capacitor;

a processor configured to execute a program;

a memory that stores the program which, when executed by the processor, causes the processor to execute steps comprising:

outputting a repetitive signal for switching between the connection and the interruption by the repetitive signal output circuit based on a voltage value of the second terminal;

monitoring the repetitive signal to detect a charge period of the coupling capacitor;

monitoring the repetitive signal to detect a discharge period of the coupling capacitor;

calculating a repetitive signal charge-side leakage determination threshold for the charge period based on a voltage applied to the first terminal of the coupling capacitor and the temperature of the coupling capacitor detected by the temperature detection section;

calculating a repetitive signal discharge-side leakage determination threshold for the discharge period based on the voltage applied to the first terminal of the coupling capacitor and the temperature of the coupling capacitor detected by the temperature detection section;

comparing the charge period with the repetitive signal charge-side leakage determination threshold, and determining that a charge-side leakage occurs in the leakage detection target when the charge period is larger than the repetitive signal charge-side leakage determination threshold; and comparing the discharge period with the repetitive signal discharge-side leakage determination threshold, and determining that a discharge-side leakage occurs in the leakage detection target when the discharge period is larger than the repetitive signal discharge-side leakage determination threshold, wherein the calculating the repetitive signal discharge-side leakage determination threshold comprises:

decreasing the repetitive signal discharge-side leakage determination threshold when the voltage applied to the first terminal of the coupling capacitor increases or the temperature of the coupling capacitor increases; and increasing the repetitive signal discharge-side leakage determination threshold when the voltage applied to the first terminal of the coupling capacitor decreases or the temperature of the coupling capacitor decreases.

7. An electric leak detector for a vehicle of claim 6, wherein the calculating the repetitive signal charge-side leakage determination threshold comprises:

increasing the repetitive signal charge-side leakage determination threshold when the voltage applied to the first terminal of the coupling capacitor increases or the temperature of the coupling capacitor increases; and decreasing the repetitive signal charge-side leakage determination threshold when the voltage applied to the first terminal of the coupling capacitor decreases or the temperature of the coupling capacitor decreases.

8. An electric leak detector for a vehicle, the electric leak detector comprising:

a constant voltage control power source configured to be fed and driven by a battery so as to generate a control power supply voltage, the battery including a negative terminal connected to a vehicle body;

a coupling capacitor including a first terminal and a second terminal, the first terminal being connected to a leakage detection target, the second terminal being connected to the constant voltage control power source;

a repetitive signal output circuit connected to the second terminal of the coupling capacitor, and configured to repeatedly connect and interrupt the second terminal to and from the constant voltage control power source in an alternating manner, to thereby repeat a charge operation and a discharge operation of the coupling capacitor;

a temperature detection section configured to detect a temperature of the coupling capacitor during the charge operation and the discharge operation of the coupling capacitor;

a processor configured to execute a program;

a memory that stores the program which, when executed by the processor, causes the processor to execute steps comprising:

outputting a repetitive signal for switching between the connection and the interruption by the repetitive signal output circuit based on a voltage value of the second terminal;

monitoring the repetitive signal to detect a discharge period of the coupling capacitor;

calculating a repetitive signal charge-side leakage determination threshold for the charge period based on a voltage applied to the first terminal of the coupling capacitor and the temperature of the coupling capacitor detected by the temperature detection section;

calculating a repetitive signal discharge-side leakage determination threshold for the discharge period based on the voltage applied to the first terminal of the coupling capacitor and the temperature of the coupling capacitor detected by the temperature detection section;

comparing the charge period with the repetitive signal charge-side leakage determination threshold, and determining that a charge-side leakage occurs in the leakage detection target when the charge period is larger than the repetitive signal charge-side leakage determination threshold; and comparing the discharge period with the repetitive signal discharge-side leakage determination threshold, and determining that a discharge-side leakage occurs in the leakage detection target when the discharge period is larger than the repetitive signal discharge-side leakage determination threshold, wherein the repetitive signal comprises a binary pulse signal having a first signal level and a second signal level, and wherein the outputting of the repetitive signal comprises:
setting, when the voltage of the second terminal of the coupling capacitor is lower than a lower limit threshold, the signal level of the repetitive signal to be the first signal level, and using the repetitive signal output circuit to connect the second terminal and the constant voltage control power source to each other so as to charge the coupling capacitor; and setting, when the voltage of the second terminal of the coupling capacitor is equal to or higher than an upper limit threshold, the signal level of the repetitive signal to be the second signal level, and using the repetitive signal output circuit to interrupt the second terminal and the constant voltage control power source from each other so as to discharge the coupling capacitor.

9. An electric leak detector for a vehicle of claim 8, wherein the calculating the repetitive signal charge-side leakage determination threshold comprises:

increasing the repetitive signal charge-side leakage determination threshold when the voltage applied to the first terminal of the coupling capacitor increases or the temperature of the coupling capacitor increases; and decreasing the repetitive signal charge-side leakage determination threshold when the voltage applied to the first terminal of the coupling capacitor decreases or the temperature of the coupling capacitor decreases.

10. An electric leak detector for a vehicle of claim 8, wherein the calculating the repetitive signal discharge-side leakage determination threshold comprises:

decreasing the repetitive signal discharge-side leakage determination threshold when the voltage applied to the first terminal of the coupling capacitor increases or the temperature of the coupling capacitor increases; and increasing the repetitive signal discharge-side leakage determination threshold when the voltage applied to the first terminal of the coupling capacitor decreases or the temperature of the coupling capacitor decreases.

* * * * *